United States Patent [19]
Yanagawa et al.

[11] Patent Number: 6,156,462
[45] Date of Patent: Dec. 5, 2000

[54] PHOTOSENSITIVE RESIN COMPOSITIONS, CURED FILMS THEREOF, AND CIRCUIT SUBSTRATES

[75] Inventors: Makoto Yanagawa; Rinzo Tachibana; Hiroshi Yamamoto, all of Saitama; Tetsuji Ishikawa, Kanagawa; Tetsuo Kurokawa, Kanagawa; Kohichi Ishida, Kanagawa, all of Japan

[73] Assignee: Tamura Kaken Co., Ltd., Japan

[21] Appl. No.: 09/133,881

[22] Filed: Aug. 14, 1998

Related U.S. Application Data

[62] Division of application No. 08/646,464, May 8, 1996, Pat. No. 5,853,957.

[30] Foreign Application Priority Data

Aug. 5, 1995 [JP] Japan ..................................... 7-132618

[51] Int. Cl.$^7$ ..................................... B32B 5/16
[52] U.S. Cl. ................. 430/18; 430/14; 430/11; 430/315; 430/280.1; 428/206; 428/208; 438/948; 522/103
[58] Field of Search ................. 430/315, 14, 18, 430/11, 280.1; 428/206, 208; 438/948; 522/103

[56] References Cited

U.S. PATENT DOCUMENTS

| | | |
|---|---|---|
| 3,989,610 | 11/1976 | Tsukada et al. . |
| 4,025,348 | 5/1977 | Tsukada et al. . |
| 4,146,452 | 3/1979 | Weber et al. . |
| 4,544,623 | 10/1985 | Audykowski et al. . |
| 4,970,135 | 11/1990 | Kushi et al. ..................... 430/280.1 |
| 4,996,132 | 2/1991 | Tazawa et al. . |
| 5,009,982 | 4/1991 | Kamayachi et al. . |
| 5,093,223 | 3/1992 | Iwasawa et al. . |
| 5,178,988 | 1/1993 | Leech et al. ..................... 430/280.1 |
| 5,202,216 | 4/1993 | Aotani et al. . |
| 5,478,690 | 12/1995 | Kanda et al. . |
| 5,521,053 | 5/1996 | Ikeda et al. . |
| 5,591,562 | 1/1997 | Komatsu et al. . |
| 5,770,347 | 6/1998 | Saitoh et al. ..................... 430/280.1 |

FOREIGN PATENT DOCUMENTS

| | | |
|---|---|---|
| 0633503A1 | 1/1995 | European Pat. Off. . |
| 5140451 | 7/1973 | Japan . |
| 50-144431 | 11/1975 | Japan . |
| 6017045 | 9/1985 | Japan . |
| 154390 | 11/1989 | Japan . |
| 3154059 | 7/1991 | Japan . |
| 3172301 | 7/1991 | Japan . |
| 659448 | 3/1994 | Japan . |

*Primary Examiner*—Cynthia Hamilton
*Attorney, Agent, or Firm*—King and Schickli, PLLC

[57] ABSTRACT

For instance, when a washing-free yet low-residue type of flux is coated on a solder resist film, soldering can be carried out while no solder balls remain on a circuit substrate.

A photosensitive resin composition comprises a photopolymerizable and photosensitive resin having at least one of a carboxyl group and an onium group, a photopolymerizable reactive diluent, a photopolymerization initiator, a thermosetting component, and an inorganic powder having an average particle size of 2 $\mu$m to 20 $\mu$m. A cured film thereof is used as a solder resist film for circuit substrate fabrication.

A washing-free yet low-residue type of flux is so uniformly coated on the solder resist film that soldering can be carried out in the absence of any solder ball. The resulting film is improved in terms of various properties such as resistance to heat and chemicals by adding the thermosetting component thereto, and is improved in terms of the ability to be developed due to the presence of the carboxyl group and can be developed by use of water alone when the onium group is introduced therein. Circuit substrates can be fabricated with high reliability and high productivity.

12 Claims, No Drawings

PHOTOSENSITIVE RESIN COMPOSITIONS, CURED FILMS THEREOF, AND CIRCUIT SUBSTRATES

This is a division of U.S. patent application Ser. No. 08/646,464 filed May 8, 1996 now issued as U.S. Pat. No. 5,853,957.

BACKGROUND OF THE INVENTION

1. Field of the Invention

The present invention relates to a photosensitive resin composition for forming solder resist films, etc., a cured coating film thereof, and a circuit substrate formed of such a cured film.

2. Prior Art

A circuit substrate, for instance, a printed circuit substrate is fabricated by forming a circuit interconnecting pattern on a copper-clad laminate, for example. One circuit unit can then be formed by mounting electronic components on the circuit substrate. The electronic components such as capacitors and resistors are connected and fixed by soldering to a copper foil land, i.e., a soldering land of the circuit interconnecting pattern.

An insulating film called a solder resist film is provided over all surface portions of a circuit interconnection-including substrate except a soldering land, thereby ensuring that any possible soldering of interconnections that must not be connected together is avoided and any possible surface corrosion of copper is prevented.

The soldering of electronic components on a printed circuit substrate is achieved by a so-called flow soldering process wherein a chip form of electronic component having electrodes at both its ends is provisionally held at a given position of the printed circuit substrate such that the electrodes are located at a soldering land, and the provisionally held electronic component is allowed to come in contact with a flow of molten solder, so that the electronic component can be soldered on the soldering land, or a so-called reflow soldering process wherein while the electrodes of an electronic component are located at a soldering land pre-coated with solder paste, as mentioned just above, solder powders of the soldering paste are molten by heating, so that the electronic component can be soldered on the soldering land.

Regardless of whether the flow or the reflow soldering process is used, the electronic component and soldering land are allowed to come in contact with a flow of molten solder or are coated with solder paste after a flux has been applied on the soldering land. By doing so, the oxidation of copper foils of the soldering land due to heat, etc., generated during soldering can be avoided to make soldering satisfactory. The soldering land of a printed circuit substrate is heated to 200° C. to 200° C. during soldering. If the soldering flux is applied on the soldering land to form flux coating thereon, then the flux film cuts off oxygen to prevent oxidation of the copper foils and reduces the oxides that have already occurred, so that the molten solder can be well wettted. This is true even when the surface of the soldering land is exposed or provided with a protecting film.

For such a flux, a rosin type of resin is often used. This flux is composed mainly of rosin and contains activators such as amine halides and organic acids as subordinate components, all dissolved in an alcoholic solvent. When an ordinarily used flux having a solid content as high as 10% is used with any desired coating techniques such as dipping and foaming, a coating thickness of at least a few micrometers is achievable. Thus, even when the surface to be coated has relatively large asperities, it can be well covered with a uniform coating. However, the coating film contains ionic substances, and the rosin used has a softening point of about 100° C. or is soft, so that dust is likely to stick thereto. To make better insulation between soldering lands, the coating film must be washed and, to this end, it is required to use an organic solvent.

In recent years, however, diffusion of a fluorine type of solvents in the air has caused grave concern in view of environmental pollution, and so the use of such solvents, especially flon is, or will be, prohibited. To cope with this, a so-called washing-free yet low-residue type of flux is now under development so as to fabricate products without recourse to any washing step responsible for diffusion of an organic solvent while a flux film remain intact thereon. The flux used must have a solid content as low as 2%. However, such a flux film is thin; so it is remarkably affected by the physical properties of the surface to be coated. Even when the application surface is a solder resist film, its physical properties often cause the flux film to be irregularly coated.

For instance, when soldering is carried out with a flow soldering apparatus, so-called solder balls of several tens micrometers in diameter are often left on a flux film. The solder balls are once oxidized, but are then reduced by the reducing agent contained in the flux. Since the force with which the solder balls stick to a flow of molten solder is larger than that with which they stick to the flux film or portions of the flux film sticking to the solder balls stick to the solder resist film, the solder balls are absorbed in the flow of molten solder, so that no solder can be left on the flux film or the solder resist film. Exposed surface portions of the solder resist film on which no flux film has been formed are intrinsically not readily wetted with molten solder. The solder balls, if occur, are oxidized by those surface portions to form oxides. Since the adhesive force of the oxides to the solder resist film is larger than the force with which they stick to the flow of molten solder, the oxides are hardly absorbed in the flow of molten solder; so they are likely to remain.

Thus, the solder balls tend to remain on the exposed surface portions of the solder resist film on which no flux film has been formed. The solder resist film used is usually formed of ultraviolet-curable resin or thermosetting resin. The solder resist film is now increasingly required to have high resolution and precision, because electronic components are mounted on a printed substrate at high density to make electronic equipment compact and, to achieve this, the interconnecting density of the printed circuit substrate must be increased with an increase in the interconnecting density between soldering lands. To this end, it has been proposed to use a liquid photo-solder resist composition. For instance, JP-A-50-144431 and JP-A-51-40451 disclose a process for forming a solder resist film by coating a photosensitive composition comprising a bisphenol epoxy acrylate, a photosensitizer, a thermosetting epoxy compound with a setting agent therefor, and the like all over a printed circuit substrate by screen printing, removing the solvent from the coating film by volatilization, exposing the coating film to light while a negative film with an interconnecting pattern formed thereon is placed on the coating film, and developing the exposed coating film with a solvent to dissolve and remove an unexposed non-image portion therefrom.

Thus, a solder resist film is developed using a photosensitive composition developable with a dilute alkali solution in order to eliminate the risk of environmental pollution and fires which may otherwise be caused by the use of a photosensitive composition in which such an organic solvent is used for developers or which itself contains an organic solvent, and of an organic solvent type of developer. However, when such a solder resist film, especially one having a glossy appearance is used with a washing-free yet low-residue type of flux, non-uniform coating tends to occur, that is to say, local portions of the solder resist film are not coated at all.

In the case of products having a solder resist film with solder balls remaining thereon, the solder balls move about on the solder resist film while the products are handled. Especially in the case of a recently developed printed circuit substrate having an interconnecting density of about 100 μm, the interconnections are often short-circuited. To avoid this, it is required to remove the solder balls. However, it is not easy to remove solder balls from all interconnections for as many as several thousand components mounted on one printed circuit. Thus, problems arise in connection with productivity as well as reliability.

Among conventional photosensitive resins of the type that is developable with an aqueous solution of dilute alkali, for instance, there are a photo-solder resist composition comprising a reaction product obtained by the reaction of a reaction product between a novolac epoxy resin and an unsaturated monocarboxylic acid with a polybasic acid anhydride, a photopolymerization initiator, a diluent and an epoxy compound (see JP-B-1-54390), a one-pack type of photo-solder resist comprising an adduct of a portion of carboxyl groups of a (meth)acrylic ester-(meth)acrylic acid copolymer with a (meth)acrylic ester having a terminal epoxy group, a diluent and a photopolymerization initiator (see Japanese Patent Application No. 1-311710), and a photosensitive composition comprising a novolac resin and an onium compound (see JP-A-60-175045 and JP-A-3-154059). These compositions are developable with an aqueous dilute alkali solution due to the presence of carboxyl groups introduced therein, and an onium type of component used therewith. However, an organic solvent is still needed when they are coated on a printed circuit substrate, and care must taken of post-development disposal of the alkali solution used as well. Thus, the aforesaid compositions have yet to be improved in view of mass fabrication. To achieve this, an alternative photosensitive resin composition which is not only developable by use of water alone but is also capable of forming a high-precision pattern with sensitivity improvement is put forward (see JP-A-6-59448). In this case, too, solder balls remain unavoidably due to such non-uniform coating as mentioned above. An improvement in this regard is desired.

As explained above, parts and devices are mounted on a printed circuit substrate at high density and with high precision by soldering while such parts and devices are provisionally held in place. To meet recent demands with increasing severity, care should be taken of the following requirements at much higher levels. Any possible detachment of the parts, etc., must be reduced as much as possible by enhancing the adhesive force of the adhesive used. When many parts are soldered on a printed circuit substrate, the number of points at which no predetermined soldering occurs is counted with an optical, three-dimensional automatic appearance inspector designed to pass judgment on whether soldered joints are acceptable or not. In this case, false data—actually acceptable soldered joints are often judged as unacceptable due to the reflection of light from the surrounding glossy solder resist film—should be reduced. Judgment is passed on whether the operation of a given circuit is acceptable or not with an inspector. In this case, the contact of an ICT pin of the inspector (a pin of an in-circuit tester that comes in contact with the circuit) with the circuit must be in good-enough condition. Improvements in these points are also desired.

A first object of the present invention is to provide a photosensitive resin composition capable of forming a cured film such as a solder resist film on which a liquid material such as a washing-free yet low-residue type of flux can be uniformly coated, a cured film thereof, and a circuit substrate fabricated using such a cured film.

A second object of the present invention is to provide a photosensitive resin composition capable of forming a cured film such as a solder resist film which is unlikely to produce molten metal balls such as solder balls during soldering, even when it is used with a coating composition having a low solid content such as a washing-free yet low-residue type of flux, a cured film thereof, and a circuit substrate fabricated using such a cured film.

A third object of the present invention is to provide a photosensitive resin composition capable of forming a solder resist film or the like with high resolution and high precision, a cured film thereof, and a circuit substrate fabricated using such a cured film.

A fourth object of the present invention is to provide a photosensitive resin material capable of forming a solder resist film as an example, which is improved in terms of heat resistance, adhesion to an application surface, chemical resistance, solvent resistance, electrical properties, and mechanical properties, a cured film thereof, and a circuit substrate fabricated using such a cured film.

A fifth object of the present invention is to provide a photosensitive resin composition capable of being developed with a dilute alkali solution to form a solder resist film or the like, a cured film thereof, and a circuit substrate fabricated using such a cured film.

The sixth object of the present invention is to provide a photosensitive resin composition capable of being developed by use of water alone to form a solder resist film or the like, a cured film thereof, and a circuit substrate fabricated using such a cured film.

A seventh object of the present invention is to provide a photosensitive resin composition capable of providing a cured film such as solder resist film which makes it possible to enhance the adhesion strength of the adhesive used for provisional fixation of parts and devices such as surface mount devices and strap lines, reduce false data output of a three-dimensional automatic appearance inspector, and improve the contact of an ICT pin with a given circuit, a cured film thereof, and a circuit substrate fabricated using such a cured film.

A eighth object of the present invention is to provide a photosensitive resin composition which substantially eliminates the risk of environmental pollution and fires, a cured film thereof, and a circuit substrate fabricated using such a cured film.

A ninth object of the present invention is to provide a circuit substrate with no electronic components mounted thereon, which is improved in terms of soldering productivity and reliability.

An tenth object of the present invention is to provide a circuit substrate with electronic components mounted thereon, which is improved in terms of productivity without detriment to circuit performance, and is inexpensive as well.

SUMMARY OF THE INVENTION

To achieve the aforesaid objects, the present invention provides (1) a photosensitive resin composition comprising a photopolymerizable and photosensitive resin having at least one of a carboxyl group and an onium-containing group, a photopolymerizable reactive diluent, a photopolymerizaton initiator, and an inorganic powder having an average particle size of 2 µm to 20 µm.

The present invention also provides (2) a composition as recited in the aforesaid (1), which further comprises a thermosetting component; (3) a composition as recited in the aforesaid (1) or (2), wherein at least 10% by weight of non-crystalline silica is used as the inorganic powder; (4) a composition as recited in the aforesaid (1), (2) or (3), wherein the photopolymerizable and photosensitive resin having a carboxyl group is a prepolymer that is a reaction product of an epoxy resin.α,β-unsaturated carboxylate and 0.2 to 1.0 mole of a polybasic acid and/or its anhydride per epoxy equivalent of said epoxy resin, said epoxy resin.α,β-unsaturated carboxylate being a reaction product of an epoxy resin and 0.3 to 1.2 moles of an α, β-unsaturated carboxylic acid per epoxy equivalent of said epoxy resin; (5) a composition as recited in the aforesaid (4), wherein the epoxy resin is an epoxy resin having at least two terminal epoxy groups or a copolymer of a plurality of monomers containing a monomer represented by the following general formula (1);

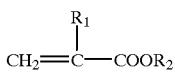
(1)

where $R_1$ is a hydrogen atom or a methyl group, and $R_2$ is an aliphatic hydrocarbon group having 1 to 6 carbon atoms, and a monomer represented by the following general formula (2):

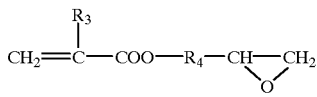
(2)

where $R_3$ is a hydrogen atom or a methyl group, and $R_4$ is a $C_{1-12}$ aliphatic hydrocarbon group or an aromatic hydrocarbon group; (6) a composition as recited in the aforesaid (1), (2) or (3), wherein the photopolymerizable and photosensitive resin containing an onium group is an onium group-containing prepolymer comprising a copolymer having an acryloyl or methacryloyl group introduced into a portion of an epoxy group thereof and an onium group introduced in another portion, said copolymer comprising at least one monomer selected from an alkyl acrylate and an alkyl methacrylate and at least one monomer selected from an epoxy group-containing acrylate and an epoxy group-containing methacrylate; (7) a composition as recited in the aforesaid (6), wherein the molar ratio between said at least one monomer selected from an alkyl acrylate and an alkyl methacrylate and said at least one monomer selected from an epoxy group-containing acrylate and an epoxy group-containing methacrylate is in the range of 40:60 to 60:20; (8) a composition as recited in the aforesaid (6) or (7), wherein the acryloyl or methacryloyl group is introduced into 20 to 80 mol % of the epoxy group in said copolymer and the onium group is introduced into 80 to 20 mol % thereof; (9) a composition as recited in the aforesaid (6), (7) or (8), wherein the prepolymer has an average molecular weight of 20,000 to 70,000; (10) a composition as recited in any one of the aforesaid (1) to (9), wherein the photopolymerizable reactive diluent is an acrylate and/or methacrylate containing at least two polymerizable double bonds per molecule; (11) a composition as recited in any one of the aforesaid (2) to (10), wherein the thermosetting component comprises a thermosetting epoxy compound; (12) a composition as recited in any one of the aforesaid (1) to (11), which comprises 0.5 to 50 parts by weight of the photopolymerization initiator and 2 to 40 parts by weight of the photopolymerizable reactive diluent per 100 parts by weight of the onium group-containing prepolymer; (13) a composition as recited in any one of the aforesaid (1) to (12), which is a solder resist ink for forming circuit substrates; (14) a cured film which has been obtained by the photocuring and thermal setting of a coating film of the photosensitive resin composition as recited in any one of the aforesaid (1) to (12); (15) a cured film as recited in the aforesaid (14), which has a surface roughness of 2.5 to 10 µm; (16) a circuit substrate having a solder resist film obtained by the photocuring and thermal setting of a coating film of the photosensitive resin composition as recited in the aforesaid (13); (17) a circuit substrate as recited in the aforesaid (16), wherein the solder resist film has a surface roughness of 2.5 to 10 µm; (18) a circuit substrate as recited in the aforesaid (16) or (17) on which no electronic components are mounted; and (19) a circuit substrate as recited in the aforesaid (16) or (17), on which electronic components are mounted.

DETAILED DESCRIPTION OF THE INVENTION

The "photopolymerizable and photosensitive resin having a carboxyl group" contained in the photosensitive resin composition according to the present invention is exemplified by a prepolymer with a carboxyl group added to a side chain thereof, which is obtained by the reaction of an epoxy resin.α,β-unsaturated carboxylate with 0.2 to 1.0 mole of a polybasic acid and/or an anhydride thereof per epoxy equivalent of said epoxy resin. It is here noted that the epoxy resin.α,β-unsaturated carboxylate is a reaction product of an epoxy group-containing oligomer or polymer, for instance, an oligomer or polymer containing at least two terminal epoxy groups, and 0/3 to 1.2 moles of an α,β-unsaturated carboxylic acid, e.g., an α,β-unsaturated mono-carboxylic acid per epoxy equivalent of said epoxy resin. It is also understood that especially when the epoxy resin is not of the copolymer type to be described later, the number of moles of the unsaturated carboxylic acid used is 0.3 to 0.9 moles per epoxy equivalent of the epoxy resin. The epoxy group-containing oligomer or polymer used herein has usually an epoxy equivalent of up to 1,000, preferably 100 to 500, although not critical.

Exemplary mention is made of copolymers of at least one monomer selected from the group consisting of bisphenol A epoxy resin, bisphenol F epoxy resin, bisphenol S epoxy resin, biphenyl epoxy resin, brominated epoxy resin, alicyclic epoxy resin, isomerized cyclic epoxy resin, aliphatic epoxy resin, phenol novolac epoxy resin, cresol novolac epoxy resin, naphthalene novolac epoxy resin, glycidylamine epoxy resin, a bisphenol S modified novolac type of polyfunctional epoxy resin, a polyfunctional modified novolac type of epoxy resin, a condensed epoxy resin of phenols and aromatic aldehydes having a phenolic hydroxyl group, alkyl acrylates and alkyl methacrylates, and at least one epoxy group-containing monomer selected from the group consisting of epoxy group-containing (meth) acrylates.

The copolymer used herein, for instance, may include those of a plurality of monomers containing the monomers represented by the aforesaid general formulae (1) and (2). Included in monomers other than those represented by formulae (1) and (2) are styrene and the like. These copolymers may be prepared by ordinarily available processes, for instance, solution polymerization.

The molar ratio of the compound represented by formula (1) to the compound represented by formula (2) should preferably lies in the range of 40:60 to 80:20. When the amount of compound (2) is too small or the molar ratio of compound (1) to compound (2) exceeds 80:20, there is a decrease in the amount of meth(acrylic) acid and polybasic acid anhydride added to the aforesaid copolymer at the subsequent step. As a result, the ability of the prepolymer film to be cured by exposure to ultraviolet rays, and the post-curing ability of the prepolymer film to be developed with an aqueous solution of dilute alkali become worse. When the amount of compound (2) is too large or the molar ratio of compound (1) to compound (2) does not reach 40:60, the softening point of the prepolymer tends to become too low.

Exemplary compounds of formula (1) are methyl, ethyl, propyl, isopropyl, butyl, isobutyl, pentyl, isopentyl, hexyl, and isohexyl esters of acrylic and methacrylic acids.

Exemplary compounds of formula (2) are glycidyl acrylate, and glycidyl methacrylate.

To obtain a copolymer epoxy resin.(meth)acrylate, this copolymer may be allowed to react with 0.8 to 1.2 moles of the α,β-unsaturated monocarboxylic acid, e.g., (meth) acrylic acid per epoxy equivalent of the copolymer. The prepolymer obtained by the reaction between this copolymer epoxy resin.(meth)acrylate and the polybasic acid and/or its anhydride should preferably have a weight-average molecular weight of 20,000 to 70,000 as measured by liquid chromatography according to GPC (gel permeation chromatography), a softening point of 35 to 130° C. as measured by TMA (thermal expansion and thermomechanical analysis), and an acid number of 50 to 150.

The polybasic acid anhydride used herein is preferably 3-methylhexahydrophthalic anhydride, 4-methylhexahydrophthalic anhydride, 3-ethylhexahydrophthalic anhydride, tetrahydrophthalic anhydride, 3-methyltetrahydrophthalic anhydride, 4-methyltetrahydrophthalic anhydride, and 3-ethyltetrahydrophthalic anhydride. Polybasic acids obtained by hydrolysis of these anhydrides, too, may be used. These polybasic acids and their anhydrides may be used in combination. Aliphatic polybasic acids such as maleic acid and fumaric acid or their anhydrides may be used as well.

The photosensitive resin composition of the present invention, when containing the prepolymer having too low a weight-average molecular weight, becomes worse in terms of heat resistance upon cured into film, and when containing the prepolymer having too high a weight-average molecular weight, is likely to become worse in terms of its solubility in the photopolymerizable reactive diluent and workability as well. The photosensitive resin composition of the present invention containing the prepolymer having too low a softening point is not preferable, because it still remains sticky even upon coated and dried. This may in turn cause a negative film to stick to the coating during exposure. The prepolymer having too high a softening point may possible make the ability of a coating film of the photosensitive resin composition to be cured by exposure to ultraviolet rays worse. The prepolymer having too low an acid number is not preferable because after the photosensitive resin composition of the present invention has been photocured into film, it is difficult to remove unexposed portions of the film by a development treatment using an aqueous dilute alkali solution. With the prepolymer having too high an acid number, on the other hand, the photosensitive resin composition of the present invention may tend to become worse in terms of electrical properties and wettability upon cured into film.

The "photopolymerizable and photosensitive resin containing an onium group" is exemplified by an onium group-containing prepolymer obtained by forming a copolymer of at least one monomer selected from an alkyl acrylate and an alkyl methacrylate and at least one epoxy group-containing monomer selected from an epoxy group-containing acrylate and an epoxy group-containing methacrylate, and introducing an acryloyl or methacryloyl group in a portion of the copolymer while introducing an onium group-containing group into another portion of the copolymer. More specifically, this onium group-containing prepolymer is prepared by obtaining a copolymer by the copolymerization of a monomer represented by the aforesaid formula (1) provided that $R_2$ is a $C_{1-6}$ alkyl group or other alkyl group and an epoxy group-containing monomer represented by the aforesaid formula (2) provided that $R_4$ is a $C_{1-12}$ aliphatic hydrocarbon group, or other aliphatic or aromatic hydrocarbon group, and allowing the copolymer to react with an unsaturated fatty acid represented by the following general formula (3):

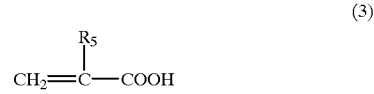

(3)

where $R_5$ is a hydrogen atom or a methyl group, thereby introducing an acryloyl or methacryloyl group in a portion of the glycidyl group and then with an onium compound, thereby introducing an onium-containing group into another portion of the glycidyl group.

The compounds represented by formulae (1), (2) and (3) may be used alone or in combination of two or more. The epoxy group-containing monomer represented by formula (2), for instance, includes glycidyl acrylate, glycidyl methacrylate, (2-epoxyethyl) acrylate, (2-epoxyethyl) methacrylate, (4-epoxybenzyl) acrylate, and (4-epoxybenzyl) methacrylate. For exemplary compounds represented by formulae (1) and (2) the same monomers as mentioned above may again be used.

The onium compound used for the reaction for the introduction of the onium-containing group, for instance, is a sulfonium compound represented by the following general formula $[R_6S^+]X^-$, where $R_6$ is an alkyl or aryl group and $X^-$ is an anion, such as triphenylsulfonium and tributylsulfonium salts; an aryliodonium salt represented by the following general formula $[Ar_2I^+]X^-$, where Ar is an aromatic ring group and $X^-$ is anion, such as diphenyliodonium chloride and diphenyliodonium hexafluorophosphate; a phosphonium compound represented by the following general formula $[R_7P^-]X^-$, where $R_7$ is an alkyl or aryl group and X– is an anion, such as tetramethylphosphonium iodide and tetraethylphosphonium bromide; and an ammonium compound represented by the following general formula $[R_8N^+]X^-$, where $R_8$ is an alkyl or aryl group and $X^-$ is an anion, such as tetramethylammonium chloride and tetraethylammonium chloride.

When the onium group-containing prepolymer is formed, the molar ratio between the monomer represented by formula (1) and the glycidyl group-containing monomer represented by formula (2) is preferably selected from the range of 40:60 and 80:20. When the proportion of the glycidyl group-containing monomer represented by formula (2) is less than the lower limit, the amount of the acryloyl or methacryloyl group introduced becomes small, thus making it difficult to cure the photosensitive resin composition by ultraviolet rays. When this proportion increases, there is a drop of the softening point of a pattern film obtained by curing a coating film of the photosensitive resin composition, which is in turn liable to cause tacks.

Referring then to the proportion of the copolymer of the monomer represented by formula (1) and the glycidyl group-containing monomer represented by formula (2) with respect to the unsaturated fatty acid represented by formula (3), it is preferable that the molar ratio between the glycidyl group in the copolymer and the unsaturated fatty acid is selected from the range of 20:80 and 80:20. When the proportion of the unsaturated fatty acid used is less than the lower limit, it is difficult to cure the photosensitive resin composition by ultraviolet rays. When the proportion of the unsaturated fatty acid is larger than the upper limit, the proportion of residual glycidyl groups becomes small, resulting in a reduction of the onium group content and, hence, insufficient water solubility.

Instead of the direct reaction of the onium compound with residual glycidyl groups in the copolymer, a compound capable of forming an onium salt, for instance, a trialkylphosphine, a tertiary amine or an alkyl sulfide may be used in the presence of an anion supply source, for instance, a halide or an organic acid. The organic acid used herein may be formic acid, acetic acid, acrylic acid, methacrylic acid, lactic acid, crotonic acid, maleic acid, fumaric acid, itaconic acid, or the like.

The thus obtained onium group-containing prepolymer has preferably an average molecular weight lying in the range as mentioned above.

The aforesaid prepolymer may be used in combination with the onium group-containing prepolymer. Alternatively, the onium group may be introduced into the former while the carboxyl group may be introduced into the latter. By the introduction of the onium group it is possible to enhance the water solubility of the resin composition and so develop it by use of water alone.

The photosensitive resin composition of the present invention contains inorganic powder which is typically exemplified by non-crystalline silica, amorphous silica, high-purity crystalline silica, talc, clay, titanium oxide, calcium carbonate, aluminum hydroxide, alumina, barium sulfate, hydrous silicic acid, antimony trioxide, magnesium carbonate, mica powder, aluminum silicate, and magnesium silicate. Other inorganic fillers may also be used.

The inorganic powder used herein has an average particle size of 2 $\mu$m to 20 $\mu$m, preferably 5 $\mu$m to 15 $\mu$m. The photosensitive resin composition of the present invention, when it contains the inorganic powders having an average particle size of less than 2 $\mu$m, is less than satisfactory in terms of surface roughness upon finally cured into film, and poor in terms of pot life in the form of solution. With the inorganic powders having an average particle size larger than 20 $\mu$m, on the other hand, the photosensitive resin composition becomes poor in terms of film resolution during exposure and development as well as in terms of hardness and adhesion upon finally cured into film.

When two or more types of inorganic powders are used, the average particle size thereof may be found by multiplying the average particle size and amount in weight % of each type of inorganic powder and summing up the products.

Preferably, the photosensitive resin composition of the present invention contains at least 10% by weight of the inorganic powder or powders. The inorganic powder, when contained at less than 10% by weight in the photosensitive resin composition, is unsatisfactory for the surface roughness and hardness of the finally cured film thereof. The inorganic powder, when contained excessively in the photosensitive resin composition, is less than satisfactory in terms of the resolution of the film thereof during exposure and development, and is poor in the adhesion of the finally cured film thereof. Thus, the content of the inorganic powder or powders in the photosensitive resin composition preferably lies in the range of 10% by weight to 40% by weight inclusive.

Preferably, the inorganic powders are uniformly dispersed in the photosensitive resin composition, and it is preferable to this end to mill them by means of a three-roll mill, for instance.

Particularly preferred among the inorganic powders is non-crystalline silica having an average particle size of 2 $\mu$m to 12 $\mu$m. The amount of the non-crystalline silica contained in the photosensitive resin composition of the present invention is at least 5% by weight, preferably at least 10% by weight. If at least 5% by weight, preferably at least 10% by weight of the non-crystalline silica is used with or without other inorganic powder, the effects on the surface roughness of the cured film of the photosensitive resin composition, for instance, are much more improved when compared with the sole use of said other inorganic powder.

The photopolymerizable reactive diluent used herein serves as a solvent for both the aforesaid prepolymer and the onium group-containing prepolymer, and is the component required to make the photocuring of the photosensitive resin composition sufficient and achieve good-enough resistance of the final film obtained by the subsequent thermal setting of the photocured film to acids, heat, chemicals, alkalis, and the like, if required.

The photopolymerizable reactive diluent used herein is typically exemplified by 1,4-butanediol di(meth)acrylate, 1,6-hexanediol di)meth)acrylate, neopentyl glycol di(meth) acrylate, polyethylene glycol di)meth)acrylate, neopentyl glycol adipate di(meth)acrylate, hydroxypivalate neopentyl glycol di(meth)acrylate, dicyclopentanyl di(meth)acrylate, caprolactone modified dicyclopentenyl di(meth)acrylate, EO modified phosphate di(meth)acrylate, allylated cyclohexyl di(meth)acrylate, isocyanurate di(meth)acrylate, trimethylolpropane tri(meth)acrylate, dipentaerythritol tri(meth) acrylate, propionic acid modified dipentaerythritol tri(meth) acrylate, pentaerythritol tri(meth)acrylate, PO modified trimethylolpropane tri(meth) acrylate, tris)acryloxyethyl) isocyanurate, propionic acid modified dipentaerythritol penta(meth)acrylate, dipentaerythritol hexa(meth)acrylate, and caprolactone modified pentaerythritol hexa(meth) acrylate. Thus, the (meth)acrylates, or acrylates and/or methacrylates, having at least two double bonds per molecule are preferably used.

The aforesaid di- through hexa-functional photopolymerizable reactive diluents may be used alone or in admixture. The amount of the photopolymerizable reactive diluent used lies suitably in the range of 2.0 to 40 parts by weight, preferably 4.0 to 20 parts by weight per 100 parts by weight of the aforesaid prepolymer or the aforesaid onium group-containing prepolymer, At less than 2.0 parts by weight, no sufficient photocuring is achievable. Even when the thermosetting component to be described later is set after photocuring, the resultant thermoset film is still less than satisfactory in terms of resistance to acids, heat, and the like.

At more than 40 parts by weight, on the other hand, violent tack occurs, and so a negative film sticks to the coating during exposure to such an extent that it cannot be removed therefrom; that is, no desired cured film is obtainable.

The photopolymerization initiator contained in the photosensitive resin composition of the present invention is typically exemplified by benzoin, benzoin methyl ether, benzoin ethyl ether, benzoin isopropyl ether, benzoin-n-butyl ether, benzoin isobutyl ether, acetophenone, dimethylaminoacetophenone, 2,2-dimethoxy-2-phenylacetophenone, 2,2-diethoxy-2-phenylacetophenone, 2-hydroxy-2-methyl-1-phenylpropan-1-1-one, 1-hydroxycyclohexyl phenyl ketone, 2-methyl-1-[4-(methylthio)phenyl]-2-morpholino-propan-1-one, benzophenone, 4,4'-diethylaminobenzophenone, dichlorobenzophenone, 2-methylanthraquinone, 2-ethylanthraquinone, 2-t-butylanthraquinone, 2-aminoanthraquinone, 2-methylthioxanthone, 2-ethylthioxanthone, 2-chlorothioxanthone, 2,4-dimethylthioxanthone, 2,4-diethylthioxanthone, bynzyl dimethyl ketal, acetophenone dimethyl ketal, and ethyl p-dimethylaminobenzoate. These initiators may be used alone or in admixture. The amount of the initiator or initiators used is preferably 0.5 to 50 parts by weight, preferably 2.0 to 30 parts by weight per 100 parts by weight of the aforesaid prepolymer or the onium group-containing prepolymer.

If required, the photosensitive resin composition of the present invention may additionally contain a thermosetting component exemplified by thermosetting epoxy compounds, and amino resins such as n-butylated melamine resin, isobutylated melamine resin, butylated urea resin, butylated melamine-urea co-condensation resin, and benzoguanamine co-condensation resin.

Among others, preference is given to the thermosetting epoxy resins typically exemplified by bisphenol A epoxy resin, bisphenol F epoxy resin, phenol novolac epoxy resin, cresol novolac epoxy resin, N-glycidyl epoxy resin or alicyclic epoxy resin (e.g., EHPE-3150 made by Dicel Chemical Industries, and epoxy resin YX-4000 made by Yuka Shell Epoxy K.K.), hydrogenated bisphenol A epoxy resin, and triglycidyl isocyanurate. In particular, YX-4000, cresol novolac epoxy resin, and TEPIC-S (epoxy resin: tris(2,3-epoxypropyl) isocyanurate made by Nissan Chemical Industries, Ltd.) are preferable.

The thermosetting component may be used alone or in combination with a reaction promoter exemplified by known epoxy curing promoters such as melamine derivatives, imidazole derivatives, and phenolic derivatives.

The amount of the thermosetting component used lies preferably in the range of 5 to 40 parts by weight based on the aforesaid prepolymer or the aforesaid onium group-containing prepolymer. When the amount of the thermosetting component used is less than 5 parts by weight, the final cured film obtained from the photosensitive resin composition of the present invention may often become insufficient in terms of resistance to heat, solvents, and acids, adhesion to a printed circuit, for instance, and its electrical properties such as insulation resistance. The photosensitive resin composition, when containing more than 40 parts by weight of the thermosetting component, becomes poor in photosensitivity and its ability to be developed.

If required, the photosensitive resin composition of the present invention may additionally contain an organic solvent, an organic pigment or coloring material such as those based on phthalocyanine and azo compounds, a leveling agent such as silicone compounds, acrylate copolymers, and fluorine surfactants; an adhesion imparting agent such as silane coupling agents; a thixotropic agent such as aerogels; a polymerization inhibitor such as hydroquinone, hydroquinone monomethyl ether, pyrogallol, t-butyl catechol, and phenothiazine; a dispersion stabilizer such as various surfactants, and high-molecular dispersants; and various additives such as anti-halation agents, fire retardants, defoamers, and anti-oxidants.

To prepare the photosensitive resin composition of the present invention, 2 to 40, preferably 4 to 20 parts by weight of the photopolymerizable reactive diluent, 0.5 to 50, preferably 2 to 30 parts by weight of the photopolymerization initiator, and 10 to 40 parts by weight of the inorganic powders are mixed with 100 parts by weight of the aforesaid prepolymer or the aforesaid onium group-containing prepolymer used as the photopolymerizable and photosensitive resin having a carboxyl group, optionally with 5 to 40 parts by weight of the thermosetting component, and further optionally with an organic solvent and such additives as mentioned above. Then, the mixture is mixed together for 0.5 hours, for instance, by means of a three-roll mill or the like to disperse the solid components in the liquid components, thereby obtaining a dispersion. The dispersion has preferably a solid content of 40 to 80% by weight and a viscosity of 0.5 to 300 d.$P_{a.s}$ as measured at 25° C.

The thus obtained photosensitive resin composition is coated on a circuit substrate at a thickness of 10 to 100 $\mu$m (measured as wet film thickness) by means of screen printing, curtain coating, roll coating, spin coating, or dip coating, and then dried at 60 to 80° C. for 15 to 60 minutes, followed by volatilization of the organic solvent, etc. Subsequently, the dried film is irradiated with ultraviolet rays through a negative film having a desired circuit pattern, which is brought into close contact therewith.

Then, the negative film is removed from the coating film for development with a developer in the form of an aqueous dilute alkali solution, so that unexposed portions of the film can be removed, but exposed portions of the film can remain intact because they have been photocured. The aqueous diluent alkali solution used herein may usually be an aqueous solution containing 0.5 to 5% by weight of sodium carbonate, but other alkali solutions, too, may be used. It is here to be understood that a cured film obtained from the photosensitive resin composition comprising the onium group-containing prepolymer can be developed by use of water alone.

The coating film is then thermally set at 130 to 160° C. for 90 to 20 minutes by means of a drier with internal air circulation, for instance, thereby obtaining a solder resist film.

This solder resist film is observed to have no glossy appearance and be roughened on the surface. The surface roughness is regulated to 2.5 to 7.0 $\mu$m or at most 10 $\mu$m by adjusting the average particle size of the raw inorganic powders to 2 $\mu$m to 20 $\mu$m, as will be explained in the examples to be described later. The surface roughness is regulated to at least 2.5 $\mu$m, preferably 3 $\mu$m to 10 $\mu$m inclusive.

The photosensitive resin composition of the present invention may be used in the form of solder resist ink for circuit substrates such as printed circuit substrates, and the cured film thereof may be used as a solder resist film. Circuit substrates having such a film with electronic components being or being not mounted thereon can be fabricated with improved productivity and reliability. However, the present invention is also applicable to a wide range of fields inclusive of general-purpose paints, photosensitive adhesives, and printing materials.

The cured film obtained from the photosensitive resin composition containing the inorganic powders having an average particle size of 2 $\mu$m to 20 $\mu$m is roughened on the surface, as will be explained at great length in the examples to be given later. For instance, even when a washing-free yet low-residue type flux is coated on the film, the area of contact of the flux with the film is increased due to an increase in the surface area of the film. Moreover, since the flux is confined within the surface asperities of the film, it appears that the flux is hardly repelled by he film, thus making it difficult to form droplets.

For instance, consider the case where a flux having a low solid content is uniformly coated on the solder resist film. In a flow soldering apparatus, for instance, a flow of molten solder comes into contact with the solder resist film through the flux film. The molten solder in contact with the flux film is readily entrapped in the flow of solder together with flux film having a low softening point, so that solder balls are unlikely to occur. If solder balls should occur, their oxides would be reduced to metal balls and easily combined into the flow of molten solder. It is thus believed that the possibility that such solder balls remain intact can be substantially reduced.

Since the film is roughened on the surface, the ability of the film to receive ultraviolet rays is so improved that not only is the curing of an exposed coating film promoted but also the cured film has an increased surface area. Thus, the adhesion strength of the adhesive used for provisional fixation of parts and for fixing devices in place—the so-called anchor effect—is improved so that when numerous parts are soldered on a printed circuit substrate, the number of points where no predetermined soldering occurs can be reduced with an improvement in the contact of an ICT pin with the circuit thereon. The reason why these advantages are achievable is still unclear, and so the foregoing are some possible explanations.

The film of the photosensitive resin composition of the present invention, because of containing the component having a carboxyl group, is developable with a dilute alkali solution even upon exposure. When containing an onium group, the film of the photosensitive resin composition can be developed by use of wear alone due to its strong polarity. These films can then be thermoset to improve their physical properties so that they can be suitable for use as solder resists.

EXAMPLES

The present invention will now be explained more specifically with reference to the examples.

First, a prepolymer was prepared as the photopolymerizable and photosensitive resin having a carboxyl group in the following synthesis methods.

Synthesis Example 1 (Use of Existing Epoxy Resin)

Two hundred and seven (207) parts by weight of cresol novolac epoxy resin (Epichron N-665 with an epoxy equivalent of 207, made by Dainippon Ink & Chemicals, Inc.) and 72 parts by weight of acrylic acid were allowed to react with each other while Carbitol acetate was refluxed as a solvent to obtain a cresol novolac epoxy acrylate. Seventy six (76) parts by weight of hexahydrophthalic anhydride were added to the epoxy acrylate for reaction under reflux until the acid value reached the theoretical value (or the total amount of the acrylic acid added was almost completely esterfied), thereby obtaining a prepolymer solution having a solid content of 70%. This will hereinafter be called a prepolymer solution RC-1.

Synthesis Example 2 (Use of Synthesized Copolymer Epoxy Resin)

Methyl methacrylate (MMA) and glycidyl methacrylate (GMA) were mixed together at a molar ratio of 6:4. and an ethyl cellosolve solvent was then added to the mixture at an amount of 40% by weight. Thereafter, the mixture was subjected to solution polymerization at 60° C. in a nitrogen gas atmosphere and in the presence of azoisobutyronitrile acting as a catalyst, thereby obtaining a copolymer. Following this, acrylic acid was permitted to react with the copolymer at 1.05 moles per epoxy equivalent of copolymer, and then with 0.8 moles of tetrahydrophthalic anhydride after the acid value was kept constant. By analysis, the prepolymer obtained by this reaction was found to have a weight-average molecular weight of 30,000, a softening point of 60° C., and an acid number of 100. This will hereinafter be called a preoplymer solution RC-2.

Then, an onium group-containing prepolymer was prepared as the photopolymerizable and photosensitive resin containing an onium group in the following manner.

Synthesis Example 3

A mixture of 100 parts by weight of methyl methacrylate (MMA), 616 parts by weight of ethyl methacrylate (EA), 234 parts by weight of glycidyl methacrylate (GMA) and 30 parts by weight of axoisobutyronitrile was charged together with 500 parts by weight of n-butanol in a four-necked flask for a 10-hour solution polymerization at 60° C. in a nitrogen gas atmosphere, thereby obtaining a copolymer. After the completion of the polymerization, 72 parts by weight of acrylic acid, 0.5 parts by weight of hydroquinone and 1 part by weight of tetramethylammonium chloride were added to the copolymer for reaction at 110° C. until an acid number of 0 was reached. Then, 60 parts by weight of acetic acid and 39 parts by weight of dimethylaminoethanol were added to the reaction product for a four-hour reaction at 70° C. The thus obtained resin solution was heated and dried under reduced pressure to evaporate off n-butanol to obtain an onium group-containing prepolymer having an average molecular weight of 35,000 and a softening point of 75° C.

Subsequently, 667 parts by weight of water were added to this prepolymer to obtain a resin solution having a solid content of 65%. This will hereinafter be called an onium group-containing prepolymer solution RC-3.

Synthesis Example 4

A resin solution was obtained substantially following Synthesis Example 3 with the exeption that 75 parts by weight of trimethylphosphine were used instead of dimethylaminoethanol. This will hereinafter be called an onium group-containing prepolymer solution RC-4.

Synthesis Example 5

A resin solution was obtained substantially following Synthesis Example 3 with the exception that 62 parts by weight of methyl sulfide were used instead of dimethylaminoethanol. This will hereinafter be called an onium group-containing prepolymer solution RC-5.

EXAMPLE 1

In the amounts (by weight) shown at the column of Example 1 in Table 1, Solvesso #150 (an aromatic solvent made by Shell Chemicals Co.) was placed in a vessel to which prepolymer solution RC-1 obtained in Synthesis Example 1, dipentaerythritol hexaacrylate, Irgacure 907 (a photo-polymerization initiator: 2-methyl-1-[4-(methylthio) phenyl]-2- morpholinopropanone-1 made by Ciba-Geigy AG), and Kayacurre DETX (a photopolymerization initiator: 2,4-diethylthio-zanthone made by Nippon Kayaku K.K.) were added under agitation. While agitation was continued, inorganic powders, i.e., non-crystalline silica (with an average particle size of 10 μm), barium sulfate (with an average particle size of 3 μm), talc powders (with an average particle size of 2 μm) were added to the solution together with subordinate agents, i.e., Modaflow (a leveling agent made by Nonsanto Co.) and phthalocyanine green (pigment). TEPIC-S (thermosetting epoxy resin made by Nissan Chemical Industries, Ltd.) and dicyandiamide (a thermosetting promoter for epoxy resin) were further added to the solution for a 20-minute stirring.

The thus obtained mixture composition was well mixed for a further 30 minutes by means of a three-roll mill to prepare a photosensitive resin composition had a solid content of 75% by weight and a viscosity of 200 d.P$_{a.s}$ as measured at 25° C. (using a measuring instrument Visco-Tester VT-04 made by Rion K.K.).

Next, a printed circuit substrate with a circuit substrate with a circuit formed thereon by the etching of a copper foil surface was pretreated by the process comprising the steps of decreasing, soft-etching, washing, drying, and the like. Then, the thus pretreated printed circuit substrate was coated thereon with the aforesaid photosensitive resin composition solution (at a liquid film thickness of 35 μm) by means of screen printing, and pre-dried (at 80° C. for 20 minutes). Following this, the coating was exposed to light (of 400 mj/cm$^2$), developed (by immersion in a 1% aqueous solution of sodium carbonate at normal temperature for 60 seconds), dried, and post-cured (thermally cured at 150° C. for 30 minutes) to form a solder resist film.

Test specimens obtained from the printed circuit substrate with the solder resist film formed thereon in this way were tested as will be described later. The results are shown in Table 2.

EXAMPLES 2 to 6

Photosensitive resin composition solutions were prepared substantially following Example 1 with the exception that the starting components were changed as shown at the columns of Examples 2–6 in Table 1.

Test specimens were obtained and tested substantially following Example 1 with exception that these photosensitive resin composition solutions were used. The results are shown in Table 2.

COMPARATIVE EXAMPLES 1 to 3

Photosensitive resin composition solutions were prepared substantially following Example 1 with the exception that the starting components were changed as shown at the columns of Comparative Examples 1–3 in Table 1.

Test specimens were obtained and tested substantially following Example 1 with the exception that these photosensitive resin composition solutions were used. The results are shown in Table 2.

TABLE 1

|  | Photosensitive Resin Composition | | | | | | | | |
|---|---|---|---|---|---|---|---|---|---|
|  | Examples | | | | | | Comp. Examples | | |
|  | 1 | 2 | 3 | 4 | 5 | 6 | 1 | 2 | 3 |
| Prepolymer solution RC-1 | 50 | 50 | 50 |  |  |  | 50 | 50 | 50 |
| Prepolymer solution RC-2 |  |  |  | 50 | 50 | 50 |  |  |  |
| Dipentaerythritol hexaacrylate | 4 | 4 | 4 | 4 | 4 | 4 | 4 | 4 | 4 |
| Irgacure 907 | 5 | 5 | 5 | 5 | 5 | 5 | 5 | 5 | 5 |
| Kayacure DETX | 1 | 1 | 1 | 1 | 1 | 1 | 1 | 1 | 1 |
| Non-crystalline silica (average particle size of 10 μm) | 15 | 10 | 5 | 15 | 10 | 5 |  |  |  |
| Non-crystalline silica (average particle size of 1 μm) |  |  |  |  |  |  | 15 |  |  |
| High-purity crystalline silica (average particle size of 4.2 μm) |  |  |  |  |  |  |  | 7 |  |
| Barium sulfate (average particle size of 0.3 μm) | 3 | 8 | 13 | 3 | 8 | 13 | 3 | 11 | 18 |
| Talc (average particle size of 2 μm) | 1 | 1 | 1 | 1 | 1 | 1 | 1 | 1 | 1 |
| Modaflow | 1 | 1 | 1 | 1 | 1 | 1 | 1 | 1 | 1 |
| TEPIC-S | 10 | 10 | 10 | 10 | 10 | 10 | 10 | 10 | 10 |
| Dicyandiamide | 1 | 1 | 1 | 1 | 1 | 1 | 1 | 1 | 1 |
| Phthalocyanine green | 0.5 | 0.5 | 0.5 | 0.5 | 0.5 | 0.5 | 0.5 | 0.5 | 0.5 |
| Solvesso #150 | 4.5 | 4.5 | 4.5 | 4.5 | 4.5 | 4.5 | 4.5 | 4.5 | 4.5 |
| Calculated total average particle size of inorganic powders in μm | 8.0 | 5.5 | 2.9 | 8.0 | 5.5 | 2.9 | 0.9 | 1.8 | 0.4 |

TABLE 2

|  | Examples | | | | | | Comp. Examples | | |
|---|---|---|---|---|---|---|---|---|---|
|  | 1 | 2 | 3 | 4 | 5 | 6 | 1 | 2 | 3 |
| SBT | ≦5 | ≦5 | ≦25 | ≦5 | ≦5 | ≦25 | ≧50 | ≧50 | ≧50 |
| HRS | ∘∘ | ∘∘ | ∘∘ | ∘∘ | ∘∘ | ∘∘ | ∘∘ | ∘∘ | ∘∘ |
| CR | ∘∘ | ∘∘ | ∘∘ | ∘∘ | ∘∘ | ∘∘ | ∘∘ | ∘∘ | ∘∘ |
| SR | ∘∘ | ∘∘ | ∘∘ | ∘∘ | ∘∘ | ∘∘ | ∘∘ | ∘∘ | ∘∘ |
| IR | $5 \times 10^{11}$ | $5 \times 10^{11}$ | $5 \times 10^{11}$ | $1 \times 10^{11}$ | $1 \times 10^{11}$ | $1 \times 10^{11}$ | $5 \times 10^{11}$ | $5 \times 10^{11}$ | $5 \times 10^{11}$ |
| Dic | ∘ | ∘ | ∘ | ∘ | ∘ | ∘ | ∘ | ∘ | ∘ |
| S | 8 | 8 | 8 | 10 | 10 | 10 | 8 | 8 | 8 |
| SR | 6 | 3 | 2.5 | 7 | 4 | 2.5 | 1.5 | 1.5 | 1.2 |
| Dev | ∘∘ | ∘∘ | ∘∘ | ∘∘ | ∘∘ | ∘∘ | ∘∘ | ∘∘ | ∘∘ |
| Ad | ∘∘ | ∘∘ | ∘∘ | ∘∘ | ∘∘ | ∘∘ | ∘∘ | ∘∘ | ∘∘ |

TABLE 2-continued

|  | Examples | | | | | | Comp. Examples | | |
| --- | --- | --- | --- | --- | --- | --- | --- | --- | --- |
|  | 1 | 2 | 3 | 4 | 5 | 6 | 1 | 2 | 3 |
| PH | 5H | 5H | 5H | 5H | 5H | 5H | 5H | 5H | 5H |
| SMD | 29.0 Kg/(1 mg × 2 spots) on the average | | | | | | 23.0 Kg/(1 mg × 2 spots) on the average | | |
| SL | 698 g/5φ on the average | | | | | | 374 g/5φ on the average | | |
| FDO | 0.2 to 0.4%/1500 points on the average | | | | | | 0.5 to 1.3%/1500 points on the average | | |
| ICT | 0.5 to 1.0%/100 sheets on the average (the number of points per sheet is two to three thousand) | | | | | | 2.0 to 3.0%/100 sheets on the average (same as left) | | |

SBT: Solder ball tests
HRS: Heat resistance of solder
CR: Chemical resistance
SR: Solvent resistance
IR: Insulation resistance in Ω
Dic: Discoloration
S: Sensitivity
SR: Surface roughness in μm
Dev: Ability to be developed with a dilute alkali solution
Ad: Adhesion
SMD: Bonding strength of SMDs bonded with adhesives
SL: Bonding strength of strap lines bonded with adhesive
FDO: False data output of a three-dimensional automatic appearance inspector
ICT: Contact with ICT pin

EXAMPLE 7

In the amounts (by weight) shown at the column of Example 7 in Table 3, the aforesaid prepolymer solution RC-3, Dalcure 2959 (4-(2-hydrozyethoxy)phenyl-2-(hydrozy-2-propyl) ketone made by Merck Japan), A-200 (polyethylene glycol diacrylate made by Sin-Nallamural Kagaku K.K.) and Denacol diacrylate made by Shin-Nakamural Kagaku K.K.) and Denacol EX.301 (triglycidyl tris (2-hydroxyethyl) isocyanurate made by Nagase Kasei Kogyo K.K.) were agitated in a vessel, and while the agitation was continued, inorganic powders, i.e., non-crystalline silica (having an average particle diameter of 10 μm), barium sulfate (having an average particle diameter of 0.3 μm ) and talc (having an average particle diameter of 0.3 μm) were added together with a subordinate agent comprising phthalocyanine green (pigment) to the mixture for a further 20-minute agitation.

The thus obtained mixture composition was well mixed for a further 30 minutes by means of a three-roll mill to prepare a photosensitive resin composition solution.

Next, a printed circuit substrate with a circuit formed thereon by the etching of a copper foil surface was pretreated by the process comprising the steps of degreasing, soft-etching, washing, drying, and the like. Then, the thus pretreated printed circuit substrate was coated thereon with the aforesaid photosensitive resin composition solution (at a wet film thickness of 40–50 μm) by means fo screen printing, and dried (at 80° C. for 20 minutes) in a drier with internal air circulation. Following this, the coating was exposed to ultraviolet light (of 400 mj/cm$^2$) with a desirously patterned negative film i close contact therewith, developed (by immersion in tap water for 50 seconds), and post-cured (at 150° C. for 30 minutes) in a drier with internal air circulation to form a solder mask, the physical properties of the mask as measured are shown in Table 4.

EXAMPLES 8–15

Photosensitive resin composition solutions of Examples 8–15 were prepared substantially following Example 7 with the exception that the starting components were changed as shown at the columns of Examples –15 in Table 3.

Test specimens of Examples 8–15 were obtained and tested substantially following Example 7 with the exception that these photosensitive resin composition solutions were used. The results are shown in Table 4.

TABLE 3

|  | Photosensitive Resin Composition Examples | | | | | | | | |
| --- | --- | --- | --- | --- | --- | --- | --- | --- | --- |
|  | 7 | 8 | 9 | 10 | 11 | 12 | 13 | 14 | 15 |
| Prepolymer solution RC-3 | 50 | 50 | 50 | | | | | | |
| Prepolymer solution RC-4 | | | | 50 | 50 | 50 | | | |
| Prepolymer solution RC-5 | | | | | | | 50 | 50 | 50 |
| Polyethylene glycol diacrylate (A-200) | 4 | 4 | 4 | 4 | 4 | 4 | 4 | 4 | 4 |
| Dalcure 2959 | 4 | 4 | 4 | 4 | 4 | 4 | 4 | 4 | 4 |
| Non-crystalline silica (average particle size of 10 μm) | 15 | 10 | 5 | 15 | 10 | 5 | 15 | 10 | 5 |
| Barium sulfate (average particle size of 0.3 μm) | 3 | 8 | 13 | 3 | 8 | 13 | 3 | 8 | 13 |
| Talc (average particle size of 2 μm) | 1 | 1 | 1 | 1 | 1 | 1 | 1 | 1 | 1 |

TABLE 3-continued

|  | Photosensitive Resin Composition Examples | | | | | | | | |
|---|---|---|---|---|---|---|---|---|---|
|  | 7 | 8 | 9 | 10 | 11 | 12 | 13 | 14 | 15 |
| Denacol EX | 4 | 4 | 4 | 4 | 4 | 4 | 4 | 4 | 4 |
| Phthalocyanine green | 0.5 | 0.5 | 0.5 | 0.5 | 0.5 | 0.5 | 0.5 | 0.5 | 0.5 |
| Calculated total average particle size of inorganic powders in μm | 8.0 | 5.5 | 2.9 | 8.0 | 5.5 | 2.9 | 8.0 | 5.5 | 2.9 |

TABLE 4

|  | Examples | | | | | | | | |
|---|---|---|---|---|---|---|---|---|---|
|  | 7 | 8 | 9 | 10 | 11 | 12 | 13 | 14 | 15 |
| SBT | ≦5 | ≦5 | ≦27 | ≦5 | ≦5 | ≦25 | ≦5 | ≦5 | ≦25 |
| HRS | ∘∘ | ∘∘ | ∘∘ | ∘∘ | ∘∘ | ∘∘ | ∘∘ | ∘∘ | ∘∘ |
| CR | ∘∘ | ∘∘ | ∘∘ | ∘∘ | ∘∘ | ∘∘ | ∘∘ | ∘∘ | ∘∘ |
| SR | ∘∘ | ∘∘ | ∘∘ | ∘∘ | ∘∘ | ∘∘ | ∘∘ | ∘∘ | ∘∘ |
| IR (×$10^{11}$) | 3.0 | 1.4 | 2.0 | 3.0 | 1.4 | 2.0 | 3.0 | 1.4 | 2.0 |
| Dic | ∘ | ∘ | ∘ | ∘ | ∘ | ∘ | ∘ | ∘ | ∘ |
| S | 8 | 8 | 8 | 10 | 10 | 10 | 8 | 8 | 8 |
| SR | 6 | 5 | 3 | 7 | 6 | 3 | 6.5 | 5 | 2.5 |
| Dev | ∘∘ | ∘∘ | ∘∘ | ∘∘ | ∘∘ | ∘∘ | ∘∘ | ∘∘ | ∘∘ |
| Ad | ∘∘ | ∘∘ | ∘∘ | ∘∘ | ∘∘ | ∘∘ | ∘∘ | ∘∘ | ∘∘ |
| PH | 5H | 5H | 5H | 5H | 5H | 5H | 5H | 5H | 5H |

SMD 28.5 Kg/(1 mg × 2 spots) on the average
SL 690 g/5φ on the average
FDO 0.2 to 0.45%/1500 points on the average
ICT 0.5 to 1.1%/100 sheets on the average
(the number of points per sheet is two to three thousand)
Dev: Ability to be developed with water

COMPARATIVE EXAMPLES 4–6

Photosensitive resin composition solutions of Comparative Examples 4–6 were prepared substantially following Example 7 with the exception that the starting components were changed as shown at the columns of Comparative Examples 4–6 in Table 5.

Test specimens of Comparative Examples 4–6 were obtained and tested substantially following Example 7 with the exception that these photosensitive resin composition solutions were used. The results are shown in Table 6.

TABLE 5

|  | Photosensitive Resin Composition Comp. Examples | | |
|---|---|---|---|
|  | 4 | 5 | 6 |
| Prepolymer solution RC-3 | 50 |  |  |
| Prepolymer solution RC-4 |  | 50 |  |
| Prepolymer solution RC-5 |  |  | 50 |
| Polyethylene glycol diacrylate (A-200) | 4 | 4 | 4 |
| Dalcure 2959 | 4 | 4 | 4 |
| Non-crystalline silica (average particle size of 1 μm) | 15 |  |  |
| High-purity crystalline silica (average particle size of 4.2 μm) |  | 7 |  |
| Barium sulfate (average particle size of 0.3 μm) |  |  | 18 |
| Talc (average particle size of 2 μm) | 1 | 1 | 1 |
| Denacol EX | 4 | 4 | 4 |

TABLE 5-continued

|  | Photosensitive Resin Composition Comp. Examples | | |
|---|---|---|---|
|  | 4 | 5 | 6 |
| Phthalocyanine green | 0.5 | 0.5 | 0.5 |
| Calculated total average particle size of inorganic powders in μm | 0.9 | 1.8 | 0.4 |

TABLE 6

|  | Comp. Examples | | |
|---|---|---|---|
|  | 4 | 5 | 6 |
| SBT | ≧50 | ≧50 | ≧50 |
| HRS | ∘∘ | ∘∘ | ∘∘ |
| CR | ∘∘ | ∘∘ | ∘∘ |
| SR | ∘∘ | ∘∘ | ∘∘ |
| IR (× $10^{11}$) | 5 | 5 | 5 |
| Dic | ∘ | ∘ | ∘ |
| S | 8 | 8 | 8 |
| SR | 1.5 | 1.5 | 1.2 |
| Dev | ∘∘ | ∘∘ | ∘∘ |
| Ad | ∘∘ | ∘∘ | ∘∘ |
| PH | 5H | 5H | 5H |
| SMD | 22.0 Kg/(1 mg × 2 spots) on the average | | |
| SL | 370 g/5φ on the average | | |
| FDO | 0.5 to 1.4%/1500 points on the average | | |
| ICT | 2.0 to 31%/100 sheets on the average (the number of points per sheet is two to three thousand) | | |

Dev: Ability to be developed with water

Set out below are the testing procedures used.
(a) Solder ball tests

Using a flow type of automated soldering apparatus SC-30-55 (made by Tamua Seisakusho K.K.), a flux was coated on the circuit side of each test specimen, which was then pre-heated to a surface temperature of 90° C. the circuit side with the flux film formed thereon was dipped in a flow of molten solder at 250° C. for 4 seconds, and then pulled up and cooled in the air for soldering.

The flux used herein was an ultra-low-residue type of flux ULF-210R made by Tamura Kaken K.K.

The thus soldered circuit side of the test specimen was observed under a magnifier of 30 magnifications to count the number of solder balls of 10 μm or more in diameter. Specimen dimensions were 150 mm×100 mm×1.6 mm. The number of solder balls were counted over the area of 150 mm×100 m on the surface of the circuit side of the specimen.
(b) Tests for heat resistance of solder The cured film of each of the aforesaid test specimens was tested according to the testing procedure JIS C6481, i.e., subjected to a test cycle comprising a 30second dipping in a soldering tank of 260° C. and cellophane tape peeling. This test cycle was repeated 1 to 3 times. The coating film was estimated on the basis of the following four criteria.
OO: No change was observed on the coating film even after the third cycle.
O: A little change was observed on the coating film after the third cycle.
Δ: Changes were observed on the coating film a after the second cycle.
X: the coating film was peeled off in one cycle.
(c) Chemical resistance tests
After each of the aforesaid test specimens had been dipped in a 10% hydrochloric acid for 30 minutes, the coating film was observed with the naked eye, The coating film was estimated on the basis of the following four criteria.
OO: No change was observed at all.
O: A little change was observed.
Δ: Pronounced changes were observed.
X: The coating film swelled and peeled off.
(d) Solvent resistance tests
After each of the aforesaid test specimens had been dipped in methylene chloride for 30 minutes, the coating film was observed with the naked eye. The coating film was estimated on the basis of the following four criteria.
OO: No change was observed at all.
O: A little change was observed.
Δ: Pronounced changes were observed.
X: The coating film swelled and peeled off.
(e) Electrical properties (insulation resistance & discoloration)
A comb electrode of IPC-SM-840BB-25 Test Coupon was placed on the coating film of each of the aforesaid test specimen, and a d.c. voltage of 100 V was then applied across the electrode in a thermo-hygrostat maintained at 60° C. and 90% RH. After the lapse of 50 hours, the insulation resistance and the state of discoloration were evaluated.
OO: No discoloration was found at all.
O: Slight discoloration was found
Δ: Discoloration was found.
X: Black scorching was found.
(f) Sensitivity tests
A wet film (35 μm) of the photosensitive resin composition solution, coated on the aforesaid printed circuit substrate, was irradiated with ultraviolet light of 365 nm wavelength such that the quantity of ultraviolet light of the same wavelength passing through Kadak step tablets became 400 mJ/cm$^2$ as measured by an integral type of actinometer made by Oak Seisakusho K.K. After exposure, the coating film was sprayed with an aqueous solution of dilute alkali (a 1% by weight aqueous solution of sodium carbonate) at a spray pressure of 2.0 Kg/cm$^2$ for 60 seconds. Then, areas of portions of the exposed region, which were not removed, wee measured.
(g) Surface roughness tests
The surface roughness of the cured film of each of the aforesaid test specimens was measured using a combined surface roughness and shape meter Surf-Comb 570A made by Tokyo Seimitsu K.K.
(h) Development tests Development with an aqueous dilute alkaki solution
Test specimens wee irradiated with 400 mj/cm$^2$ of ultraviolet rays having a peak wavelength of 365 nm through artwork film using an actinometer made by Oak Seisajusho K.K, and then immersed in a 1% aqueous solution of sodium carbonate at normal temperature for 60 seconds to visually observe the state of the specimens from which unexposed portions were removed. Estimation was made on the following four criteria.

Development with water
Tests specimens were irradiated with 400 mj/cm$^2$ of ultraviolet ray shaving a peak wavelength of 365 nm through artwork film, using an actinometer made by Oak Seisakusho K.K, and then developed with tap water at a spray pressure of 2.0 Kg/cm$^2$ for 60 seconds to visually observe the state of the specimens form which unexposed portions were removed. Estimation was made on the following four criteria.
OO: Complete development was observed.
O: An undeveloped thin area was found on the surface.
Δ: The irradiated film was found to remain underdeveloped, and suffer from local cracking or swelling as a whole.
X: The irradiated film was little developed, and cracked or swollen thoroughly.
(i) Adhesion
According to the testing procedure JIS D .0202, test specimens were cross-cut in a grid form, and then subjected to peeling test using cellophane tapes to make visual observation of how the specimens peeled off. Estimation was made on the following criteria.
OO: No change was found at all at 100/100.
O: The cross-cut areas peeled off slightly at 100/100.
Δ: 50/100–90/100.
X: 1/100–50/100.
(j) Pencil Hardness
Estimation was made according to the testing procedure JIS K.5400.
(k) Adhesion strength tests for adhesives For provisional fixation of surface mount devices
For the purpose of fixing surface mount devices (SMDs) in place, an adhesive material was fed on two spots using a dispenser (at an amount of 1 mg per spot), and the SMDs were fixedly mounted thereon. Then, the bonding strength of SMDs (load under which they were stripped form the spots) was measured [in Kg/(1 mg×two spots)].
For fixation of strap lines
Strap lines of 2.5 mm in radius were fixedly bonded to a test specimen. Then, the bonding strength of the strap lines (load under which they were striped form the specimen) was measured (in g/φ5).
(l) Tests for false data output of a three-dimensional automatic appearance inspector for passing judgment on whether soldered joints are acceptable or not
False data output of a three-dimensional automatic appearance inspector was determined. In this inspector, actually acceptable soldered joints are often judged as unacceptable due to the reflection of light from the surrounding glossy soldered resist film.
(m) Tests for contact of an ICT pin with specimens
The contact of an ICT (in-circuit tester) pin with a test specimen was tested. When a solder resist film has a roughened surface, the deposition of flux residues thereto becomes uniform-enough to ensure the contact of the pin with the specimen, so that conduction (contact) failure due to flux residues can be reduced. Percentage of rejects per 100 specimens is given.

From the results as mentioned above, it is found that the number of solder balls counted is up to 27, more advantageously up to 5 for the final cured films obtained from the photosensitive resin compositions of the present invention, sharply contrast to 50 or more for the comparative films, and that the surface roughness is at least 2.5 or 2.5 to 7 for the inventive films, sharply contrast to 2 or less for the comparative films. The surface roughness of at least 3 achieved in the inventive examples means that the number of solder balls can be reduced to 5 or less.

From the foregoing, it is understood that with the cured films having a surface roughness of 2.5 to 7, the number of solder balls counted can be reduced to 27 or less, and with the cured films having a surface roughness of 3 to 7, the number of solder balls counted can be reduced to 5 or less.

Roughened surfaces ensure that eyestrain during inspection can be reduced. In flow soldering, an increased edge coverage is so achievable that physical and chemical yield strengths can be increased (thereby preventing cracking and peeling due to external stress, flux and solvent). It is also possible to achieve improvements in affinity for flux and, hence, solderability, appearance, reliability and workability.

According to the present invention, there can be provided a photosensitive resin composition capable of forming a cured film such as a solder resist film on which a liquid material such as a washing-free yet low-residue type of flux can be uniformly coated, forming a cured film such as a solder resist film unlikely to produce molten metal balls such as solder balls during soldering even when it is used with a coating composition having a low solid content such as a washing-free yet low-residue type of flux, and forming a solder resist film or other film with high resolution and high precision, a cured film thereof, and a circuit substrate fabricated using such a cured film.

There can also be provided a photosensitive resin composition capable of forming a solder resist film or other film which is improved in terms of heat resistance, adhesion to an application surface, chemical resistance, solvent resistance, electrical properties, and mechanical properties, forming a solder resist film or other film developable with a dilute alkali solution or even with water alone, and substantially eliminating the risk of environmental pollution and fires, a cured film thereof, and a circuit substrate fabricated using such a cured film.

There can further be provided a photosensitive resin composition that provides a cured film which makes it possible to increase the adhesive strength of adhesives used for provisional fixation of devices and parts such as surface mount devices and strap lines, reduce the false data output of a three-dimensional automatic appearance inspector, and improve the contact of an ICT pin with a given circuit, a cured film, and a circuit substrate fabricated using such a cured film.

There can still further be provided a circuit substrate with no electronic components mounted thereon, which is improved in terms of soldering productivity and reliability, and a circuit substrate with electronic components mounted thereon, which is improved in terms of productivity without detriment to circuit performance, and is inexpensive as well.

The photosensitive resin compositions according to the present invention are also usable in other fields inclusive of paints, adhesives, and printing materials, By imparting the aforesaid properties to the cured film it is possible to improve the performance thereof as well as the performance of products fabricated using such a cured film.

What we claim is:

1. A cured film comprising a photocured and thermal set coating film of a photosensitive resin composition including a photopolymerizable and photosensitive resin having a least one of a carboxyl group and an onium-containing group, a photopolymerizable reactive diluent, a photopolymerization initiator, a thermosetting component an dan inorganic powder having an average particle size of 2 $\mu$m to 20 $\mu$m, which has a surface roughness of 2.5 to 10 $\mu$m.

2. A circuit substrate having a solder resist film comprising a photocured and thermal set coating film of a photosensitive resin composition including a photopolymerizable and photosensitive resin having at least one of a carboxyl group and an onium-containing group, a photopolymerizable reactive diluent, a photopolymerization initiator, a thermosetting component, and an inorganic powder having an average particle size of 2 $\mu$m to 20 $\mu$m, wherein the solder resist film has a surface roughness of 2.5 to 10 $\mu$m.

3. The circuit substrate as recited in claim 2, on which no electronic components are mounted.

4. The circuit substrate as recited in claim 2, on which electronic components are mounted.

5. A cured film, comprising a photocured and thermal set coating film of a photosensitive resin composition including a photopolymerizable and photosensitive resin having at least one of a carboxyl group and an onium-containing group, a photopolymerizable reactive diluent, a photopolymerization initiator, a thermosetting component and an inorganic powder having an average particle size of 2 $\mu$m to 20 $\mu$m wherein the photopolymerizable and photosensitive resin having a carboxyl group os a prepolymer that is a reaction product of an epoxy resin ·$\alpha$, $\beta$-unsaturated carboxylate and 0.2 to 1.0 mole of a polybasic acid and/or its anhydride per epoxy equivalant of said epoxy resin, said epoxy resin·$\alpha$, $\beta$-unsaturated carboxylate being a reaction product of an epoxy resin and 0.3 to 1.2 moles of an $\alpha$, $\beta$-unsaturated carboxylic acid per epoxy equivalent of said epoxy resin.

6. The cured film of claim 5, wherein the epoxy resin is an epoxy resin having at least two terminal epoxy groups or a copolymer comprising a plurality of monomers containing a monomer represented by the following general formula 1):

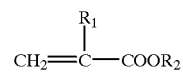

(1) where $R_1$ is a hydrogen atom or a methyl group, and $R_2$ is an aliphatic hydrocarbon group having 1 to 6 carbon atoms, and a monomer represented by the following general formula(2):

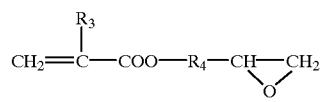

(2) where $R_3$ is a hydrogen atom or a methyl group, and $R_4$ is a $C_{1-13}$ aliphatic hydrocarbon group or an aromatic hydrocarbon group.

7. A circuit substrate having a solder resist film, comprising a photocured and thermal set coating film of a photosensitive resin composition including a photopolymerizable and photosensitive resin having at least one of a carboxyl group and an onium-containing group, a photopolymerizable reactive diluent, a photopolymerization initiator, a thermosetting component and an inorganic powder having an average particle size of 2 $\mu$m to 20 $\mu$m, wherein the photopolymerizable and photosensitive resin having a carboxyl group is a prepolymer that is a reaction product of an epoxy resin ·$\alpha$, $\beta$-unsaturated carboxylate and 0.2 to 1.0 mole of a polybasic acid and/or its anhydride pre epoxy equivalent of said epoxy resin, said epoxy resin·$\alpha$, $\beta$-unsaturated carboxylate being a reaction product of an epoxy resin and 0.3 to 1.2 moles of an $\alpha$, $\beta$-unsaturated carboxylic acid per epoxy equivalent of said epoxy resin.

8. The circuit substrate of claim 7, wherein the epoxy resin is an epoxy resin having at least two terminal epoxy groups or a copolymer comprising a plurality of monomers containing a monomer represented by the following general formula (1):

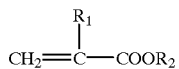

(1) where $R_1$ is a hydrogen atom or a methyl group, and $R_2$ is an aliphatic hydrocarbon group having 1 to 6 carbon atoms, and a monomer represented by the following general formula (2):

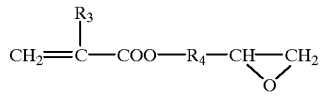

(2) where $R_3$ is a hydrogen atom or a methyl group, and $R_4$ is a $C_{1-12}$ aliphatic hydrocarbon group or an aromatic hydrocarbon group.

9. The circuit substrate as recited in claim 8, on which no electronic components are mounted.

10. The circuit substrate as recited in claim 8, on which electronic components are mounted.

11. The circuit substrate as recited in claim 7, on which no electronic components are mounted.

12. The circuit substrate as recited in claim 7, on which electronic components are mounted.

* * * * *